United States Patent
Timmermans et al.

(10) Patent No.: US 8,866,396 B2
(45) Date of Patent: *Oct. 21, 2014

(54) LIGHT TUBE AND POWER SUPPLY CIRCUIT

(71) Applicant: iLumisys, Inc., Troy, MI (US)

(72) Inventors: Jos Timmermans, Ortonville, MI (US); Jean Raymond, Nominique (CA); John Ivey, Farmington Hills, MI (US)

(73) Assignee: iLumisys, Inc., Troy, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/777,331

(22) Filed: Feb. 26, 2013

(65) Prior Publication Data
US 2013/0169179 A1     Jul. 4, 2013

Related U.S. Application Data

(63) Continuation of application No. 12/965,019, filed on Dec. 10, 2010, now Pat. No. 8,382,327, which is a continuation of application No. 11/085,744, filed on Mar. 21, 2005, now Pat. No. 8,247,985, which is a continuation of application No. 09/782,375, filed on Feb. 12, 2001, now Pat. No. 7,049,761.

(60) Provisional application No. 60/181,744, filed on Feb. 11, 2000.

(51) Int. Cl.
*H05B 39/00*     (2006.01)
*H05B 37/00*     (2006.01)

(52) U.S. Cl.
USPC ................................ 315/200 R; 315/185 R (58) Field of Classification Search
USPC ................. 315/307–308, 312, 246, 247, 224, 315/185 R, 185 S; 362/249.01, 249.03, 362/249.02, 543, 544, 548
See application file for complete search history.

(56) References Cited

U.S. PATENT DOCUMENTS

| | | |
|---|---|---|
| D84,763 S | 7/1931 | Strange |
| D119,797 S | 4/1940 | Winkler et al. |
| D125,312 S | 2/1941 | Logan |
| 2,826,679 A | 3/1958 | Rosenberg |
| 2,909,097 A | 10/1959 | Alden et al. |

(Continued)

FOREIGN PATENT DOCUMENTS

| | | |
|---|---|---|
| DE | 196 51 140 A1 | 6/1997 |
| DE | 196 24 087 A1 | 12/1997 |

(Continued)

OTHER PUBLICATIONS

Defendant's Invalidity Contentions in *Altair Engineering, Inc.* v. *LEDS America, Inc.*, Civil Case No. 2:10-CV-13424 (E. D. Mich) (J. O'Meara) (Feb. 4, 2011).

(Continued)

*Primary Examiner* — Minh D A
(74) *Attorney, Agent, or Firm* — Young Basile (57) ABSTRACT

A light tube for illumination by a power supply circuit includes a bulb portion and at least one end cap disposed on the bulb portion. A plurality of light emitting diodes is disposed inside the bulb portion for illuminating in response to electrical current to be received from the power supply circuit. The light emitting diodes are arranged in spaced-apart groupings.

20 Claims, 9 Drawing Sheets

(56) References Cited

U.S. PATENT DOCUMENTS

| | | | |
|---|---|---|---|
| 3,178,622 A | 4/1965 | Paul et al. | |
| 3,272,977 A | 9/1966 | Holmes | |
| 3,318,185 A | 5/1967 | Kott | |
| 3,561,719 A | 2/1971 | Grindle | |
| 3,586,936 A | 6/1971 | McLeroy | |
| 3,601,621 A | 8/1971 | Ritchie | |
| 3,612,855 A | 10/1971 | Juhnke | |
| 3,643,088 A | 2/1972 | Osteen et al. | |
| 3,739,336 A | 6/1973 | Burland | |
| 3,746,918 A | 7/1973 | Drucker et al. | |
| 3,818,216 A | 6/1974 | Larraburu | |
| 3,821,590 A | 6/1974 | Kosman et al. | |
| 3,832,503 A | 8/1974 | Crane | |
| 3,858,086 A | 12/1974 | Anderson et al. | |
| 3,909,670 A | 9/1975 | Wakamatsu et al. | |
| 3,924,120 A | 12/1975 | Cox, III | |
| 3,958,885 A | 5/1976 | Stockinger et al. | |
| 3,969,720 A | 7/1976 | Nishino | |
| 3,974,637 A | 8/1976 | Bergey et al. | |
| 3,993,386 A | 11/1976 | Rowe | |
| 4,001,571 A | 1/1977 | Martin | |
| 4,009,394 A | 2/1977 | Mierzwinski | |
| 4,054,814 A | 10/1977 | Fegley et al. | |
| 4,070,568 A | 1/1978 | Gala | |
| 4,082,395 A | 4/1978 | Donato et al. | |
| 4,096,349 A | 6/1978 | Donato | |
| 4,102,558 A | 7/1978 | Krachman | |
| 4,107,581 A | 8/1978 | Abernethy | |
| 4,189,663 A | 2/1980 | Schmutzer et al. | |
| 4,211,955 A | 7/1980 | Ray | |
| 4,241,295 A | 12/1980 | Williams, Jr. | |
| 4,257,672 A | 3/1981 | Balliet | |
| 4,261,029 A | 4/1981 | Mousset | |
| 4,262,255 A | 4/1981 | Kokei et al. | |
| 4,271,408 A | 6/1981 | Teshima et al. | |
| 4,271,458 A | 6/1981 | George, Jr. | |
| 4,272,689 A | 6/1981 | Crosby et al. | |
| 4,273,999 A | 6/1981 | Pierpoint | |
| 4,298,869 A | 11/1981 | Okuno | |
| 4,329,625 A | 5/1982 | Nishizawa et al. | |
| 4,339,788 A | 7/1982 | White et al. | |
| 4,342,947 A | 8/1982 | Bloyd | |
| 4,344,117 A | 8/1982 | Niccum | |
| 4,367,464 A | 1/1983 | Kurahashi et al. | |
| D268,134 S | 3/1983 | Zurcher | |
| 4,382,272 A | 5/1983 | Quella et al. | |
| 4,388,567 A | 6/1983 | Yamazaki et al. | |
| 4,388,589 A | 6/1983 | Molldrem, Jr. | |
| 4,392,187 A | 7/1983 | Bornhorst | |
| 4,394,719 A | 7/1983 | Moberg | |
| 4,420,711 A | 12/1983 | Takahashi et al. | |
| 4,455,562 A | 6/1984 | Dolan et al. | |
| 4,500,796 A | 2/1985 | Quin | |
| 4,521,835 A | 6/1985 | Meggs et al. | |
| 4,531,114 A | 7/1985 | Topol et al. | |
| 4,581,687 A | 4/1986 | Nakanishi | |
| 4,597,033 A | 6/1986 | Meggs et al. | |
| 4,600,972 A | 7/1986 | MacIntyre | |
| 4,607,317 A | 8/1986 | Lin | |
| 4,622,881 A | 11/1986 | Rand | |
| 4,625,152 A | 11/1986 | Nakai | |
| 4,635,052 A | 1/1987 | Aoike et al. | |
| 4,647,217 A | 3/1987 | Havel | |
| 4,650,971 A | 3/1987 | Manecci et al. | |
| 4,656,398 A | 4/1987 | Michael et al. | |
| 4,661,890 A | 4/1987 | Watanabe et al. | |
| 4,668,895 A | 5/1987 | Schneiter | |
| 4,669,033 A | 5/1987 | Lee | |
| 4,675,575 A | 6/1987 | Smith et al. | |
| 4,682,079 A | 7/1987 | Sanders et al. | |
| 4,686,425 A | 8/1987 | Havel | |
| 4,687,340 A | 8/1987 | Havel | |
| 4,688,154 A | 8/1987 | Nilssen | |
| 4,688,869 A | 8/1987 | Kelly | |
| 4,695,769 A | 9/1987 | Schweickardt | |
| 4,698,730 A | 10/1987 | Sakai et al. | |
| 4,701,669 A | 10/1987 | Head et al. | |
| 4,705,406 A | 11/1987 | Havel | |
| 4,707,141 A | 11/1987 | Havel | |
| D293,723 S | 1/1988 | Buttner | |
| 4,727,289 A | 2/1988 | Uchida | |
| 4,727,457 A | 2/1988 | Thillays | |
| 4,739,454 A | 4/1988 | Federgreen | |
| 4,740,882 A | 4/1988 | Miller | |
| 4,748,545 A * | 5/1988 | Schmitt | 362/219 |
| 4,753,148 A | 6/1988 | Johnson | |
| 4,758,173 A | 7/1988 | Northrop | |
| 4,765,708 A | 8/1988 | Becker et al. | |
| 4,767,172 A | 8/1988 | Hubble III, et al. | |
| 4,771,274 A | 9/1988 | Havel | |
| 4,780,621 A | 10/1988 | Bartleucci et al. | |
| 4,794,373 A | 12/1988 | Harrison | |
| 4,794,383 A | 12/1988 | Havel | |
| 4,801,928 A | 1/1989 | Minter | |
| 4,810,937 A | 3/1989 | Havel | |
| 4,818,072 A | 4/1989 | Mohebban | |
| 4,824,269 A | 4/1989 | Havel | |
| 4,837,565 A | 6/1989 | White | |
| 4,843,627 A | 6/1989 | Stebbins | |
| 4,845,481 A | 7/1989 | Havel | |
| 4,845,745 A | 7/1989 | Havel | |
| 4,847,536 A | 7/1989 | Lowe et al. | |
| 4,851,972 A | 7/1989 | Altman | |
| 4,854,701 A | 8/1989 | Noll et al. | |
| 4,857,801 A | 8/1989 | Farrell | |
| 4,863,223 A | 9/1989 | Weissenbach et al. | |
| 4,870,325 A | 9/1989 | Kazar | |
| 4,874,320 A | 10/1989 | Freed et al. | |
| 4,887,074 A | 12/1989 | Simon et al. | |
| 4,894,832 A | 1/1990 | Colak | |
| 4,901,207 A | 2/1990 | Sato et al. | |
| 4,904,988 A | 2/1990 | Nesbit et al. | |
| 4,912,371 A | 3/1990 | Hamilton | |
| 4,920,459 A | 4/1990 | Rothwell et al. | |
| 4,922,154 A | 5/1990 | Cacoub | |
| 4,929,936 A | 5/1990 | Friedman et al. | |
| 4,934,852 A | 6/1990 | Havel | |
| 4,941,072 A | 7/1990 | Yasumoto et al. | |
| 4,943,900 A | 7/1990 | Gartner | |
| 4,962,687 A | 10/1990 | Belliveau et al. | |
| 4,965,561 A | 10/1990 | Havel | |
| 4,973,835 A | 11/1990 | Kurosu et al. | |
| 4,977,351 A | 12/1990 | Bavaro et al. | |
| 4,979,081 A | 12/1990 | Leach et al. | |
| 4,979,180 A | 12/1990 | Muncheryan | |
| 4,980,806 A | 12/1990 | Taylor et al. | |
| 4,991,070 A | 2/1991 | Stob | |
| 4,992,704 A | 2/1991 | Stinson | |
| 5,001,609 A | 3/1991 | Gardner et al. | |
| 5,003,227 A | 3/1991 | Nilssen | |
| 5,008,595 A | 4/1991 | Kazar | |
| 5,008,788 S | 4/1991 | Palinkas | |
| 5,010,459 A | 4/1991 | Taylor et al. | |
| 5,018,054 A | 5/1991 | Ohashi et al. | |
| 5,027,037 A | 6/1991 | Wei | |
| 5,027,262 A | 6/1991 | Freed | |
| 5,032,960 A | 7/1991 | Katoh | |
| 5,034,807 A | 7/1991 | Von Kohorn | |
| 5,036,248 A | 7/1991 | McEwan et al. | |
| 5,038,255 A | 8/1991 | Nishihashi et al. | |
| 5,065,226 A | 11/1991 | Kluitmans et al. | |
| 5,072,216 A | 12/1991 | Grange | |
| 5,078,039 A | 1/1992 | Tulk et al. | |
| 5,083,063 A | 1/1992 | Brooks | |
| 5,088,013 A | 2/1992 | Revis | |
| 5,089,748 A | 2/1992 | Ihms | |
| 5,103,382 A | 4/1992 | Kondo et al. | |
| 5,122,733 A | 6/1992 | Havel | |
| 5,126,634 A | 6/1992 | Johnson | |
| 5,128,595 A | 7/1992 | Hara | |
| 5,130,761 A | 7/1992 | Tanaka | |
| 5,130,909 A | 7/1992 | Gross | |
| 5,134,387 A | 7/1992 | Smith et al. | |

(56) References Cited

U.S. PATENT DOCUMENTS

| | | |
|---|---|---|
| 5,136,483 A | 8/1992 | Schoniger et al. |
| 5,140,220 A | 8/1992 | Hasegawa |
| 5,142,199 A | 8/1992 | Elwell |
| 5,151,679 A | 9/1992 | Dimmick |
| 5,154,641 A | 10/1992 | McLaughlin |
| 5,161,879 A | 11/1992 | McDermott |
| 5,161,882 A | 11/1992 | Garrett |
| 5,164,715 A | 11/1992 | Kashiwabara et al. |
| 5,184,114 A | 2/1993 | Brown |
| 5,194,854 A | 3/1993 | Havel |
| 5,198,756 A | 3/1993 | Jenkins et al. |
| 5,209,560 A | 5/1993 | Taylor et al. |
| 5,220,250 A | 6/1993 | Szuba |
| 5,225,765 A | 7/1993 | Callahan et al. |
| 5,226,723 A | 7/1993 | Chen |
| 5,254,910 A | 10/1993 | Yang |
| 5,256,948 A | 10/1993 | Boldin et al. |
| 5,268,828 A | 12/1993 | Miura |
| 5,278,542 A | 1/1994 | Smith et al. |
| 5,282,121 A | 1/1994 | Bornhorst et al. |
| 5,283,517 A | 2/1994 | Havel |
| 5,287,352 A | 2/1994 | Jackson et al. |
| 5,294,865 A | 3/1994 | Haraden |
| 5,298,871 A | 3/1994 | Shimohara |
| 5,301,090 A | 4/1994 | Hed |
| 5,303,124 A | 4/1994 | Wrobel |
| 5,307,295 A | 4/1994 | Taylor et al. |
| 5,321,593 A | 6/1994 | Moates |
| 5,323,226 A | 6/1994 | Schreder |
| 5,329,431 A | 7/1994 | Taylor et al. |
| 5,344,068 A | 9/1994 | Haessig |
| 5,350,977 A | 9/1994 | Hamamoto et al. |
| 5,357,170 A | 10/1994 | Luchaco et al. |
| 5,365,411 A | 11/1994 | Rycroft et al. |
| 5,371,618 A | 12/1994 | Tai et al. |
| 5,374,876 A | 12/1994 | Horibata et al. |
| 5,375,043 A | 12/1994 | Tokunaga |
| D354,360 S | 1/1995 | Murata |
| 5,381,074 A | 1/1995 | Rudzewicz et al. |
| 5,388,357 A | 2/1995 | Malita |
| 5,402,702 A | 4/1995 | Hata |
| 5,404,094 A | 4/1995 | Green et al. |
| 5,404,282 A | 4/1995 | Klinke et al. |
| 5,406,176 A | 4/1995 | Sugden |
| 5,410,328 A | 4/1995 | Yoksza et al. |
| 5,412,284 A | 5/1995 | Moore et al. |
| 5,412,552 A | 5/1995 | Fernandes |
| 5,420,482 A | 5/1995 | Phares |
| 5,421,059 A | 6/1995 | Leffers, Jr. |
| 5,430,356 A | 7/1995 | Ference et al. |
| 5,432,408 A | 7/1995 | Matsuda et al. |
| 5,436,535 A | 7/1995 | Yang |
| 5,436,853 A | 7/1995 | Shimohara |
| 5,450,301 A | 9/1995 | Waltz et al. |
| 5,461,188 A | 10/1995 | Drago et al. |
| 5,463,280 A | 10/1995 | Johnson |
| 5,463,502 A | 10/1995 | Savage, Jr. |
| 5,465,144 A | 11/1995 | Parker et al. |
| 5,473,522 A | 12/1995 | Kriz et al. |
| 5,475,300 A | 12/1995 | Havel |
| 5,481,441 A | 1/1996 | Stevens |
| 5,489,827 A | 2/1996 | Xia |
| 5,491,402 A | 2/1996 | Small |
| 5,493,183 A | 2/1996 | Kimball |
| 5,504,395 A | 4/1996 | Johnson et al. |
| 5,506,760 A | 4/1996 | Giebler et al. |
| 5,513,082 A | 4/1996 | Asano |
| 5,519,496 A | 5/1996 | Borgert et al. |
| 5,530,322 A | 6/1996 | Ference et al. |
| 5,539,628 A | 7/1996 | Seib |
| 5,544,809 A | 8/1996 | Keating et al. |
| 5,545,950 A | 8/1996 | Cho |
| 5,550,440 A | 8/1996 | Allison et al. |
| 5,559,681 A | 9/1996 | Duarte |
| 5,561,346 A | 10/1996 | Byrne |
| D376,030 S | 11/1996 | Cohen |
| 5,575,459 A | 11/1996 | Anderson |
| 5,575,554 A | 11/1996 | Guritz |
| 5,581,158 A | 12/1996 | Quazi |
| 5,592,051 A | 1/1997 | Korkala |
| 5,592,054 A | 1/1997 | Nerone et al. |
| 5,600,199 A | 2/1997 | Martin, Sr. et al. |
| 5,607,227 A | 3/1997 | Yasumoto et al. |
| 5,608,290 A | 3/1997 | Hutchisson et al. |
| 5,614,788 A | 3/1997 | Mullins et al. |
| 5,621,282 A | 4/1997 | Haskell |
| 5,621,603 A | 4/1997 | Adamec et al. |
| 5,621,662 A | 4/1997 | Humphries et al. |
| 5,622,423 A | 4/1997 | Lee |
| 5,633,629 A | 5/1997 | Hochstein |
| 5,634,711 A | 6/1997 | Kennedy et al. |
| 5,639,158 A | 6/1997 | Sato |
| 5,640,061 A | 6/1997 | Bornhorst et al. |
| 5,640,141 A | 6/1997 | Myllymaki |
| 5,640,792 A | 6/1997 | O'Shea et al. |
| 5,642,129 A | 6/1997 | Zavracky et al. |
| 5,655,830 A | 8/1997 | Ruskouski |
| 5,656,935 A | 8/1997 | Havel |
| 5,661,374 A | 8/1997 | Cassidy et al. |
| 5,661,645 A | 8/1997 | Hochstein |
| 5,673,059 A | 9/1997 | Zavracky et al. |
| 5,682,103 A | 10/1997 | Burrell |
| 5,684,523 A | 11/1997 | Satoh et al. |
| 5,688,042 A | 11/1997 | Madadi et al. |
| 5,690,417 A | 11/1997 | Choate et al. |
| 5,697,695 A | 12/1997 | Lin et al. |
| 5,701,058 A | 12/1997 | Roth |
| 5,712,650 A | 1/1998 | Barlow |
| 5,713,655 A | 2/1998 | Blackman |
| 5,721,471 A | 2/1998 | Begemann et al. |
| 5,725,148 A | 3/1998 | Hartman |
| 5,726,535 A | 3/1998 | Yan |
| 5,731,759 A | 3/1998 | Finucan |
| 5,734,590 A | 3/1998 | Tebbe |
| 5,751,118 A | 5/1998 | Mortimer |
| 5,752,766 A | 5/1998 | Bailey et al. |
| 5,765,940 A | 6/1998 | Levy et al. |
| 5,769,527 A | 6/1998 | Taylor et al. |
| 5,784,006 A | 7/1998 | Hochstein |
| 5,785,227 A | 7/1998 | Akiba |
| 5,790,329 A | 8/1998 | Klaus et al. |
| 5,803,579 A | 9/1998 | Turnbull et al. |
| 5,803,580 A | 9/1998 | Tseng |
| 5,803,729 A | 9/1998 | Tsimerman |
| 5,806,965 A | 9/1998 | Deese |
| 5,808,689 A | 9/1998 | Small |
| 5,810,463 A | 9/1998 | Kawahara et al. |
| 5,812,105 A | 9/1998 | Van de Ven |
| 5,813,751 A | 9/1998 | Shaffer |
| 5,813,753 A | 9/1998 | Vriens et al. |
| 5,821,695 A | 10/1998 | Vilanilam et al. |
| 5,825,051 A | 10/1998 | Bauer et al. |
| 5,828,178 A | 10/1998 | York et al. |
| 5,831,522 A | 11/1998 | Weed et al. |
| 5,836,676 A | 11/1998 | Ando et al. |
| 5,841,177 A | 11/1998 | Komoto et al. |
| 5,848,837 A | 12/1998 | Gustafson |
| 5,850,126 A | 12/1998 | Kanbar |
| 5,851,063 A | 12/1998 | Doughty et al. |
| 5,852,658 A | 12/1998 | Knight et al. |
| 5,854,542 A | 12/1998 | Forbes |
| RE36,030 E | 1/1999 | Nadeau |
| 5,859,508 A | 1/1999 | Ge et al. |
| 5,865,529 A | 2/1999 | Yan |
| 5,870,233 A | 2/1999 | Benz et al. |
| 5,890,794 A | 4/1999 | Abtahi et al. |
| 5,893,633 A | 4/1999 | Saito et al. |
| 5,896,010 A | 4/1999 | Mikolajczak et al. |
| 5,904,415 A | 5/1999 | Robertson et al. |
| 5,907,742 A | 5/1999 | Johnson et al. |
| 5,909,378 A | 6/1999 | De Milleville |
| 5,912,653 A | 6/1999 | Fitch |
| 5,917,287 A | 6/1999 | Haederle et al. |

(56) References Cited

U.S. PATENT DOCUMENTS

| | | | |
|---|---|---|---|
| 5,917,534 A | 6/1999 | Rajeswaran | |
| 5,921,660 A | 7/1999 | Yu | |
| 5,924,784 A | 7/1999 | Chliwnyj et al. | |
| 5,927,845 A | 7/1999 | Gustafson et al. | |
| 5,934,792 A | 8/1999 | Camarota | |
| 5,936,599 A | 8/1999 | Reymond | |
| 5,939,830 A | 8/1999 | Praiswater | |
| 5,943,802 A | 8/1999 | Tijanic | |
| 5,946,209 A | 8/1999 | Eckel et al. | |
| 5,949,347 A | 9/1999 | Wu | |
| 5,951,145 A | 9/1999 | Iwasaki et al. | |
| 5,952,680 A | 9/1999 | Strite | |
| 5,959,547 A | 9/1999 | Tubel et al. | |
| 5,961,072 A | 10/1999 | Bodle | |
| 5,962,989 A | 10/1999 | Baker | |
| 5,962,992 A | 10/1999 | Huang et al. | |
| 5,963,185 A | 10/1999 | Havel | |
| 5,966,069 A | 10/1999 | Zmurk et al. | |
| 5,974,553 A | 10/1999 | Gandar | |
| 5,980,064 A | 11/1999 | Metroyanis | |
| 5,998,925 A | 12/1999 | Shimizu et al. | |
| 5,998,928 A | 12/1999 | Hipp | |
| 6,000,807 A | 12/1999 | Moreland | |
| 6,007,209 A | 12/1999 | Pelka | |
| 6,008,783 A | 12/1999 | Kitagawa et al. | |
| 6,010,228 A | 1/2000 | Blackman et al. | |
| 6,011,691 A | 1/2000 | Schreffler | |
| 6,016,038 A | 1/2000 | Mueller et al. | |
| 6,018,237 A | 1/2000 | Havel | |
| 6,019,493 A | 2/2000 | Kuo et al. | |
| 6,020,825 A | 2/2000 | Chansky et al. | |
| 6,025,550 A | 2/2000 | Kato | |
| 6,028,694 A | 2/2000 | Schmidt | |
| 6,030,099 A | 2/2000 | McDermott | |
| 6,031,343 A | 2/2000 | Recknagel et al. | |
| 6,031,958 A | 2/2000 | McGaffigan | |
| 6,036,335 A | 3/2000 | Openiano | |
| 6,036,636 A | 3/2000 | Konomura et al. | |
| D422,737 S | 4/2000 | Orozco | |
| 6,056,420 A | 5/2000 | Wilson et al. | |
| 6,068,383 A | 5/2000 | Robertson et al. | |
| 6,069,597 A | 5/2000 | Hansen | |
| 6,072,280 A | 6/2000 | Allen | |
| 6,084,359 A | 7/2000 | Hetzel et al. | |
| 6,086,220 A | 7/2000 | Lash et al. | |
| 6,091,200 A | 7/2000 | Lenz | |
| 6,092,915 A | 7/2000 | Rensch | |
| 6,095,661 A | 8/2000 | Lebens et al. | |
| 6,097,352 A | 8/2000 | Zavracky et al. | |
| 6,115,184 A | 9/2000 | Hubble, III et al. | |
| 6,116,748 A | 9/2000 | George | |
| 6,121,875 A | 9/2000 | Hamm et al. | |
| 6,127,783 A | 10/2000 | Pashley et al. | |
| 6,132,072 A | 10/2000 | Turnbull et al. | |
| 6,135,604 A | 10/2000 | Lin | |
| 6,135,620 A | 10/2000 | Marsh | |
| 6,139,174 A | 10/2000 | Butterworth | |
| 6,149,283 A | 11/2000 | Conway et al. | |
| 6,150,774 A | 11/2000 | Mueller et al. | |
| 6,151,529 A | 11/2000 | Batko | |
| 6,153,985 A | 11/2000 | Grossman | |
| 6,158,882 A * | 12/2000 | Bischoff, Jr. | 362/488 |
| 6,166,496 A | 12/2000 | Lys et al. | |
| 6,175,201 B1 | 1/2001 | Sid | |
| 6,175,220 B1 | 1/2001 | Billig et al. | |
| 6,181,126 B1 | 1/2001 | Havel | |
| D437,947 S | 2/2001 | Huang | |
| 6,183,086 B1 | 2/2001 | Neubert | |
| 6,183,104 B1 | 2/2001 | Ferrara | |
| 6,184,628 B1 | 2/2001 | Ruthenberg | |
| 6,196,471 B1 | 3/2001 | Ruthenberg | |
| 6,203,180 B1 | 3/2001 | Fleischmann | |
| 6,211,626 B1 | 4/2001 | Lys et al. | |
| 6,215,409 B1 | 4/2001 | Blach | |
| 6,217,190 B1 | 4/2001 | Altman et al. | |
| 6,219,239 B1 | 4/2001 | Mellberg et al. | |
| 6,227,679 B1 | 5/2001 | Zhang et al. | |
| 6,234,645 B1 | 5/2001 | Börner et al. | |
| 6,238,075 B1 | 5/2001 | Dealey, Jr. et al. | |
| 6,240,665 B1 | 6/2001 | Brown et al. | |
| 6,241,359 B1 | 6/2001 | Lin | |
| 6,249,221 B1 | 6/2001 | Reed | |
| 6,250,774 B1 | 6/2001 | Begemann et al. | |
| 6,252,350 B1 | 6/2001 | Alvarez | |
| 6,252,358 B1 | 6/2001 | Xydis et al. | |
| 6,268,600 B1 | 7/2001 | Nakamura et al. | |
| 6,273,338 B1 | 8/2001 | White | |
| 6,292,901 B1 | 9/2001 | Lys et al. | |
| 6,297,724 B1 | 10/2001 | Bryans et al. | |
| 6,305,109 B1 | 10/2001 | Lee | |
| 6,305,821 B1 | 10/2001 | Hsieh et al. | |
| 6,307,331 B1 | 10/2001 | Bonasia et al. | |
| 6,310,590 B1 | 10/2001 | Havel | |
| 6,315,429 B1 | 11/2001 | Grandolfo | |
| 6,323,832 B1 | 11/2001 | Nishizawa et al. | |
| 6,325,651 B1 | 12/2001 | Nishihara et al. | |
| 6,334,699 B1 | 1/2002 | Gladnick | |
| 6,340,868 B1 | 1/2002 | Lys et al. | |
| 6,362,578 B1 * | 3/2002 | Swanson et al. | 315/307 |
| 6,371,637 B1 | 4/2002 | Atchinson et al. | |
| 6,380,865 B1 | 4/2002 | Pederson | |
| 6,394,623 B1 | 5/2002 | Tsui | |
| 6,400,096 B1 | 6/2002 | Wells et al. | |
| 6,404,131 B1 | 6/2002 | Kawano et al. | |
| 6,411,045 B1 | 6/2002 | Nerone | |
| 6,429,604 B1 | 8/2002 | Chang | |
| 6,445,139 B1 | 9/2002 | Marshall et al. | |
| 6,459,919 B1 | 10/2002 | Lys et al. | |
| 6,464,373 B1 | 10/2002 | Petrick | |
| 6,469,457 B2 | 10/2002 | Callahan | |
| 6,471,388 B1 | 10/2002 | Marsh | |
| 6,495,964 B1 | 12/2002 | Muthu et al. | |
| 6,511,204 B2 | 1/2003 | Emmel et al. | |
| 6,528,954 B1 | 3/2003 | Lys et al. | |
| 6,540,381 B1 | 4/2003 | Douglass, II | |
| 6,541,800 B2 | 4/2003 | Barnett et al. | |
| 6,548,967 B1 | 4/2003 | Dowling et al. | |
| 6,568,834 B1 | 5/2003 | Scianna | |
| 6,577,072 B2 | 6/2003 | Saito et al. | |
| 6,577,080 B2 | 6/2003 | Lys et al. | |
| 6,577,794 B1 | 6/2003 | Currie et al. | |
| 6,582,103 B1 | 6/2003 | Popovich et al. | |
| 6,585,393 B1 | 7/2003 | Brandes et al. | |
| 6,608,453 B2 | 8/2003 | Morgan et al. | |
| 6,609,813 B1 | 8/2003 | Showers et al. | |
| 6,612,729 B1 | 9/2003 | Hoffman | |
| 6,621,222 B1 | 9/2003 | Hong | |
| 6,624,597 B2 | 9/2003 | Dowling et al. | |
| 6,682,205 B2 | 1/2004 | Lin | |
| 6,712,486 B1 | 3/2004 | Popovich et al. | |
| 6,717,376 B2 | 4/2004 | Lys et al. | |
| 6,720,745 B2 | 4/2004 | Lys et al. | |
| 6,736,525 B2 | 5/2004 | Chin | |
| 6,762,562 B2 | 7/2004 | Leong | |
| 6,768,047 B2 | 7/2004 | Chang et al. | |
| 6,774,584 B2 | 8/2004 | Lys et al. | |
| 6,777,891 B2 | 8/2004 | Lys et al. | |
| 6,781,329 B2 | 8/2004 | Mueller et al. | |
| 6,788,011 B2 | 9/2004 | Mueller et al. | |
| 6,796,680 B1 | 9/2004 | Showers et al. | |
| 6,806,659 B1 | 10/2004 | Mueller et al. | |
| 6,853,151 B2 | 2/2005 | Leong et al. | |
| 6,869,204 B2 | 3/2005 | Morgan et al. | |
| 6,888,322 B2 | 5/2005 | Dowling et al. | |
| 6,897,624 B2 | 5/2005 | Lys et al. | |
| 6,936,978 B2 | 8/2005 | Morgan et al. | |
| 6,953,261 B1 | 10/2005 | Jiao et al. | |
| 6,965,205 B2 | 11/2005 | Piepgras et al. | |
| 6,967,448 B2 | 11/2005 | Morgan et al. | |
| 6,975,079 B2 | 12/2005 | Lys et al. | |
| 7,014,336 B1 | 3/2006 | Ducharme et al. | |
| 7,031,920 B2 | 4/2006 | Dowling et al. | |

(56) References Cited

U.S. PATENT DOCUMENTS

| | | | |
|---|---|---|---|
| 7,038,398 B1 | 5/2006 | Lys et al. | |
| 7,049,761 B2 * | 5/2006 | Timmermans et al. | 315/246 |
| 7,064,498 B2 | 6/2006 | Dowling et al. | |
| 7,102,902 B1 | 9/2006 | Brown et al. | |
| 7,113,541 B1 | 9/2006 | Lys et al. | |
| 7,120,560 B2 | 10/2006 | Williams et al. | |
| 7,132,785 B2 | 11/2006 | Ducharme | |
| 7,132,804 B2 | 11/2006 | Lys et al. | |
| 7,135,824 B2 | 11/2006 | Lys et al. | |
| 7,139,617 B1 | 11/2006 | Morgan et al. | |
| 7,161,311 B2 | 1/2007 | Mueller et al. | |
| 7,161,313 B2 | 1/2007 | Piepgras et al. | |
| 7,180,252 B2 | 2/2007 | Lys et al. | |
| 7,186,003 B2 | 3/2007 | Dowling et al. | |
| 7,187,141 B2 | 3/2007 | Mueller et al. | |
| 7,221,104 B2 | 5/2007 | Lys et al. | |
| 7,231,060 B2 | 6/2007 | Dowling et al. | |
| 7,233,831 B2 | 6/2007 | Blackwell | |
| 7,242,152 B2 | 7/2007 | Dowling et al. | |
| 7,248,239 B2 | 7/2007 | Dowling et al. | |
| 7,253,566 B2 | 8/2007 | Lys et al. | |
| 7,255,457 B2 | 8/2007 | Ducharme et al. | |
| 7,274,160 B2 | 9/2007 | Mueller et al. | |
| 7,308,296 B2 | 12/2007 | Lys et al. | |
| 7,309,965 B2 | 12/2007 | Dowling et al. | |
| 7,344,278 B2 | 3/2008 | Paravantsos | |
| 7,350,936 B2 | 4/2008 | Ducharme et al. | |
| 7,353,071 B2 | 4/2008 | Blackwell et al. | |
| 7,385,359 B2 | 6/2008 | Dowling et al. | |
| 7,401,935 B2 | 7/2008 | VanderSchuit | |
| 7,427,840 B2 | 9/2008 | Morgan et al. | |
| 7,510,299 B2 | 3/2009 | Timmermans et al. | |
| 7,598,686 B2 | 10/2009 | Lys et al. | |
| 7,600,907 B2 | 10/2009 | Liu et al. | |
| RE42,161 E | 2/2011 | Hochstein | |
| 8,093,823 B1 | 1/2012 | Ivey et al. | |
| 8,247,985 B2 * | 8/2012 | Timmermans et al. | 315/246 |
| 8,382,327 B2 * | 2/2013 | Timmermans et al. | 362/249.02 |
| 2001/0033488 A1 | 10/2001 | Chliwnyj et al. | |
| 2002/0011801 A1 | 1/2002 | Chang | |
| 2002/0047569 A1 | 4/2002 | Dowling et al. | |
| 2002/0047628 A1 | 4/2002 | Morgan et al. | |
| 2002/0048169 A1 | 4/2002 | Dowling et al. | |
| 2002/0048174 A1 | 4/2002 | Pederson | |
| 2002/0057061 A1 | 5/2002 | Mueller et al. | |
| 2002/0070688 A1 | 6/2002 | Dowling et al. | |
| 2002/0074559 A1 | 6/2002 | Dowling et al. | |
| 2002/0074958 A1 | 6/2002 | Crenshaw | |
| 2002/0078221 A1 | 6/2002 | Blackwell et al. | |
| 2002/0101197 A1 | 8/2002 | Lys et al. | |
| 2002/0113555 A1 | 8/2002 | Lys et al. | |
| 2002/0130627 A1 | 9/2002 | Morgan et al. | |
| 2002/0152045 A1 | 10/2002 | Dowling et al. | |
| 2002/0153851 A1 | 10/2002 | Morgan et al. | |
| 2002/0158583 A1 | 10/2002 | Lys et al. | |
| 2002/0163316 A1 | 11/2002 | Lys et al. | |
| 2002/0171365 A1 | 11/2002 | Morgan et al. | |
| 2002/0171377 A1 | 11/2002 | Mueller et al. | |
| 2002/0171378 A1 | 11/2002 | Morgan et al. | |
| 2002/0176259 A1 | 11/2002 | Ducharme | |
| 2003/0011538 A1 | 1/2003 | Lys et al. | |
| 2003/0057884 A1 | 3/2003 | Dowling et al. | |
| 2003/0057886 A1 | 3/2003 | Lys et al. | |
| 2003/0057887 A1 | 3/2003 | Dowling et al. | |
| 2003/0057890 A1 | 3/2003 | Lys et al. | |
| 2003/0076281 A1 | 4/2003 | Morgan et al. | |
| 2003/0100837 A1 | 5/2003 | Lys et al. | |
| 2003/0133292 A1 | 7/2003 | Mueller et al. | |
| 2003/0137258 A1 | 7/2003 | Piepgras et al. | |
| 2003/0222587 A1 | 12/2003 | Dowling, Jr. et al. | |
| 2004/0052076 A1 | 3/2004 | Mueller et al. | |
| 2004/0085219 A1 | 5/2004 | Pederson | |
| 2004/0090191 A1 | 5/2004 | Mueller et al. | |
| 2004/0105261 A1 | 6/2004 | Ducharme et al. | |
| 2004/0145490 A1 | 7/2004 | Pederson | |
| 2004/0155609 A1 | 8/2004 | Lys et al. | |
| 2004/0178751 A1 | 9/2004 | Mueller et al. | |
| 2004/0212320 A1 | 10/2004 | Dowling et al. | |
| 2004/0212993 A1 | 10/2004 | Morgan et al. | |
| 2004/0240890 A1 | 12/2004 | Lys et al. | |
| 2004/0257007 A1 | 12/2004 | Lys et al. | |
| 2005/0030744 A1 | 2/2005 | Ducharme et al. | |
| 2005/0041161 A1 | 2/2005 | Dowling et al. | |
| 2005/0041424 A1 | 2/2005 | Ducharme | |
| 2005/0043907 A1 | 2/2005 | Eckel et al. | |
| 2005/0044617 A1 | 3/2005 | Mueller et al. | |
| 2005/0047132 A1 | 3/2005 | Dowling et al. | |
| 2005/0047134 A1 | 3/2005 | Mueller et al. | |
| 2005/0062440 A1 | 3/2005 | Lys et al. | |
| 2005/0063194 A1 | 3/2005 | Lys et al. | |
| 2005/0099317 A1 | 5/2005 | Pederson | |
| 2005/0151489 A1 | 7/2005 | Lys et al. | |
| 2005/0166634 A1 | 8/2005 | Lieberman et al. | |
| 2005/0174473 A1 | 8/2005 | Morgan et al. | |
| 2005/0184667 A1 | 8/2005 | Sturman et al. | |
| 2005/0236998 A1 | 10/2005 | Mueller et al. | |
| 2005/0285547 A1 | 12/2005 | Piepgras et al. | |
| 2006/0012987 A9 | 1/2006 | Ducharme et al. | |
| 2006/0016960 A1 | 1/2006 | Morgan et al. | |
| 2006/0050509 A9 | 3/2006 | Dowling et al. | |
| 2006/0109649 A1 | 5/2006 | Ducharme et al. | |
| 2006/0152172 A9 | 7/2006 | Mueller et al. | |
| 2006/0285325 A1 | 12/2006 | Ducharme et al. | |
| 2007/0030683 A1 | 2/2007 | Popovich et al. | |
| 2007/0047227 A1 | 3/2007 | Ducharme | |
| 2007/0086754 A1 | 4/2007 | Lys et al. | |
| 2007/0086912 A1 | 4/2007 | Dowling et al. | |
| 2007/0115658 A1 | 5/2007 | Mueller et al. | |
| 2007/0115665 A1 | 5/2007 | Mueller et al. | |
| 2007/0188427 A1 | 8/2007 | Lys et al. | |
| 2007/0195526 A1 | 8/2007 | Dowling et al. | |
| 2007/0258240 A1 | 11/2007 | Ducharme et al. | |
| 2008/0012506 A1 | 1/2008 | Mueller et al. | |
| 2011/0109454 A1 | 5/2011 | McSheffrey, Sr. et al. | |

FOREIGN PATENT DOCUMENTS

| | | |
|---|---|---|
| DE | 299 00 320 U1 | 5/1999 |
| DE | 298 17 609 U1 | 1/2000 |
| EP | 0 091 172 A2 | 10/1983 |
| EP | 0 124 924 B1 | 9/1987 |
| EP | 0 174 699 B1 | 11/1988 |
| EP | 0 197 602 B1 | 11/1990 |
| EP | 0 390 262 B1 | 12/1993 |
| EP | 0 359 329 B1 | 3/1994 |
| EP | 0 403 011 B1 | 4/1994 |
| EP | 0 632 511 A2 | 1/1995 |
| EP | 0 432 848 B1 | 4/1995 |
| EP | 0 525 876 B1 | 5/1996 |
| EP | 0 714 556 B1 | 1/1999 |
| EP | 0 889 283 A1 | 7/1999 |
| EP | 0 458 408 B1 | 9/1999 |
| EP | 0 578 302 B1 | 9/1999 |
| GB | 2165977 A | 4/1986 |
| GB | 2 215 024 A | 9/1989 |
| GB | 2 324 901 A | 11/1998 |
| JP | S62-241382 A | 10/1987 |
| JP | S62-248271 A | 10/1987 |
| JP | H05-102530 A | 4/1993 |
| JP | H6-54103 | 7/1994 |
| JP | 07-249467 A | 9/1995 |
| JP | 07-264036 A | 10/1995 |
| JP | H8-162677 | 6/1996 |
| JP | H11-135274 | 5/1999 |
| JP | 11-162234 A | 6/1999 |
| JP | H11-162234 A | 6/1999 |
| JP | H11-260125 A | 9/1999 |
| JP | 5102530 B2 | 12/2012 |
| WO | 99/06759 A1 | 2/1999 |
| WO | 99/10867 A1 | 3/1999 |
| WO | 99/31560 A2 | 6/1999 |

(56) References Cited

FOREIGN PATENT DOCUMENTS

| WO | 99/45312 | A1 | 9/1999 |
| WO | 99/57945 | A1 | 11/1999 |
| WO | 00/01067 | A2 | 1/2000 |

OTHER PUBLICATIONS

Decision in *Altair Engineering, Inc.* v. *LEDdynamics* (Fed. Cir. Mar. 9, 2011).

Web page at http://trucklite.com/leds_14.htm printed on Jan. 13, 2000.

Web page at http://trucklite.com/leds_2.htm printed on Jan. 13, 2000.

Web page at http://trucklite.com/leds_4.html printed on Jan. 13, 2000.

Web page at http://www.telecite.com/en/products/options_en.htm printed on Jan. 13, 2000.

Web page at http://www.dialight.com/trans.htm printed on Jan. 13, 2000.

Web page at http://www.ledlight.com/replac.htm printed on Jan. 13, 2000.

Ledtronics, apparently 1996 Catalog, apparently cover page and p. 10.

Petition for Inter Partes Review of U.S. Patent No. 8093823, IPR # 2014-00448 filed Feb. 19, 2014 in 1175 pages. (uploaded in three parts due to EFS size limits).

Claim charts submitted in initial invalidity contentions served on May 8, 2014 in Civil Case No. 2:13-cv-14961 (E.D. Mich.) in 174 pages.

Petition for Inter Partes Review of U.S. Patent No. 7,510,299, IPR #2014-00710 filed Apr. 30, 2014 in 2135 pages. (uploaded in ten parts due to EFS size limits).

Petition for Inter Partes Review of U.S. Patent No. 8,382,327, IPR #2014-01120 filed Jul. 3, 2014 in 854 pages.

Petition for Inter Partes Review of U.S. Patent No. 7,049,761, IPR # 2014-01333 filed Aug. 19, 2014, in 757 pages.

\* cited by examiner

LIGHT TUBE AND POWER SUPPLY CIRCUIT

CROSS-REFERENCE TO RELATED APPLICATIONS

This application is a continuation of U.S. patent application Ser. No. 12/965,019, filed Dec. 10, 2010 and issued as U.S. Pat. No. 8,382,327, which is a continuation of U.S. patent application Ser. No. 11/085,744, filed Mar. 21, 2005 and issued as U.S. Pat. No. 8,247,985 on Aug. 21, 2012, which is a continuation of U.S. patent application Ser. No. 09/782,375, filed Feb. 12, 2001 and issued as U.S. Pat. No. 7,049,761 on May 23, 2006, which claims the benefit of U.S. Provisional Application No. 60/181,744 filed Feb. 11, 2000.

FIELD OF THE INVENTION

The present invention relates to a light tube illuminated by LEDs (light emitting diodes) which are packaged inside the light tube and powered by a power supply circuit.

BACKGROUND OF THE INVENTION

Conventional fluorescent lighting systems include fluorescent light tubes and ballasts. Such lighting systems are used in a variety of locations, such as buildings and transit buses, for a variety of lighting purposes, such as area lighting or backlighting. Although conventional fluorescent lighting systems have some advantages over known lighting options, such as incandescent lighting systems, conventional fluorescent light tubes and ballasts have several shortcomings. Conventional fluorescent light tubes have a short life expectancy, are prone to fail when subjected to excessive vibration, consume high amounts of power, require a high operating voltage, and include several electrical connections which reduce reliability. Conventional ballasts are highly prone to fail when subjected to excessive vibration. Accordingly, there is a desire to provide a light tube and power supply circuit which overcome the shortcomings of conventional fluorescent lighting systems. That is, there is a desire to provide a light tube and power supply circuit which have a long life expectancy, are resistant to vibration failure, consume low amounts of power, operate on a low voltage, and are highly reliable. It would also be desirable for such a light tube to mount within a conventional fluorescent light tube socket.

SUMMARY OF THE INVENTION

A light tube for illumination by a power supply circuit including a bulb portion and an end cap disposed at an end of the bulb portion. A plurality of light emitting diodes is disposed inside the bulb portion and illuminate in response to electrical current. The light emitting diodes are arranged in spaced-apart banks.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
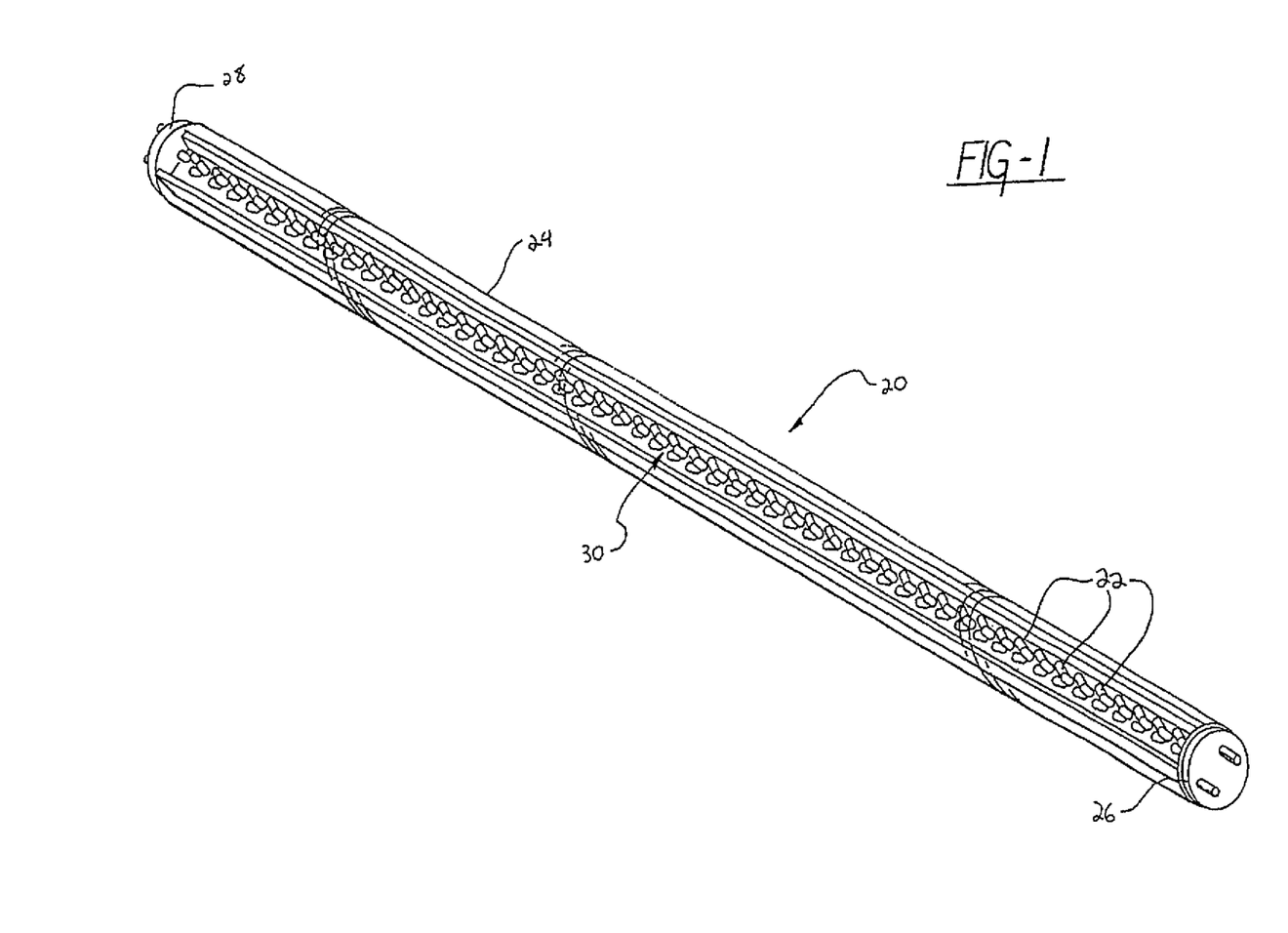
FIG. 1 is a line drawing showing a light tube, in perspective view, which in accordance with the present invention is illuminated by LEDs packaged inside the light tube.

FIG. 1 is a line drawing showing a light tube 20 in perspective view. In accordance with the present invention, the light tube 20 is illuminated by LEDs 22 packaged inside the light tube 20. The light tube 20 includes a cylindrically shaped bulb portion 24 having a pair of end caps 26 and 28 disposed at opposite ends of the bulb portion. Preferably, the bulb portion 24 is made from a transparent or translucent material such as glass, plastic, or the like. As such, the bulb material may be either clear or frosted.

In a preferred embodiment of the present invention, the light tube 20 has the same dimensions and end caps 26 and 28 (e.g. electrical male bi-pin connectors, type G13) as a conventional fluorescent light tube. As such, the present invention can be mounted in a conventional fluorescent light tube socket.

The line drawing of FIG. 1 also reveals the internal components of the light tube 20. The light tube 20 further includes a circuit board 30 with the LEDs 22 mounted thereon. The circuit board 30 and LEDs 22 are enclosed inside the bulb portion 24 and the end caps 26 and 28.

Figures 2, 3:
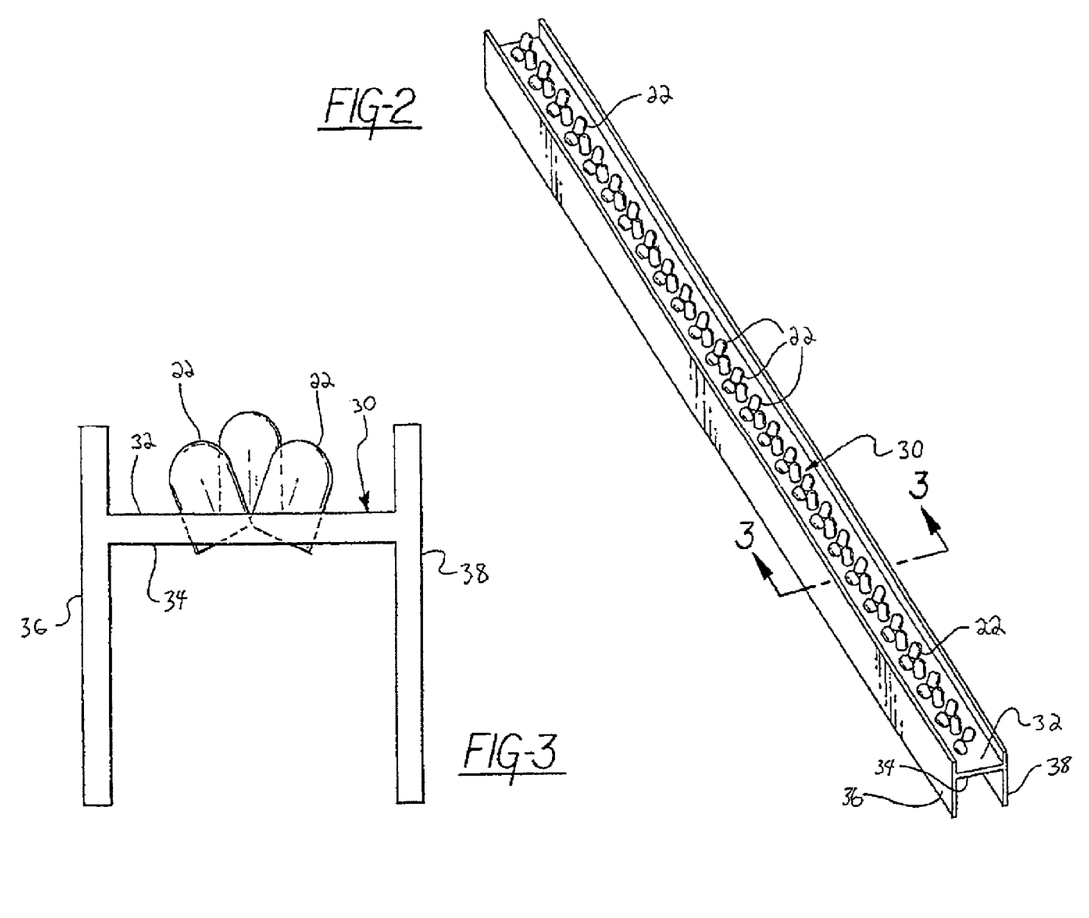
FIG. 2 is a perspective view of the LEDs mounted on a circuit board.
FIG. 3 is a cross-sectional view of FIG. 2 taken along lines 3-3.

FIG. 2 is a perspective view of the LEDs 22 mounted on the circuit board 30. A group of LEDs 22, as shown in FIG. 2, is commonly referred to as a bank or array of LEDs. Within the scope of the present invention, the light tube 20 may include one or more banks or arrays of LEDs 22 mounted on one or more circuit boards 30. In a preferred embodiment of the present invention, the LEDs 22 emit white light and, thus, are commonly referred to in the art as white LEDs. In FIGS. 1 and 2, the LEDs 22 are mounted to one surface 32 of the circuit board 30. In a preferred embodiment of the present invention, the LEDs 22 are arranged to emit or shine white light through only one side of the bulb portion 24, thus directing the white light to a predetermined point of use. This arrangement reduces light losses due to imperfect reflection in a convention lighting fixture. In alternative embodiments of the present invention, LEDs 22 may also be mounted, in any combination, to the other surfaces 34, 36, and/or 38 of the circuit board 30.

FIG. 3 is a cross-sectional view of FIG. 2 taken along lines 3-3. To provide structural strength along the length of the light tube 20, the circuit board 30 is designed with a H-shaped cross-section. To produce a predetermined radiation pattern or dispersion of light from the light tube 20, each LED 22 is mounted at an angle relative to adjacent LEDs and/or the mounting surface 32. The total radiation pattern of light from the light tube 20 is effected by (1) the mounting angle of the LEDs 22 and (2) the radiation pattern of light from each LED.

Currently, white LEDs having a viewing range between 6° and 45° are commercially available.

Figure 4:
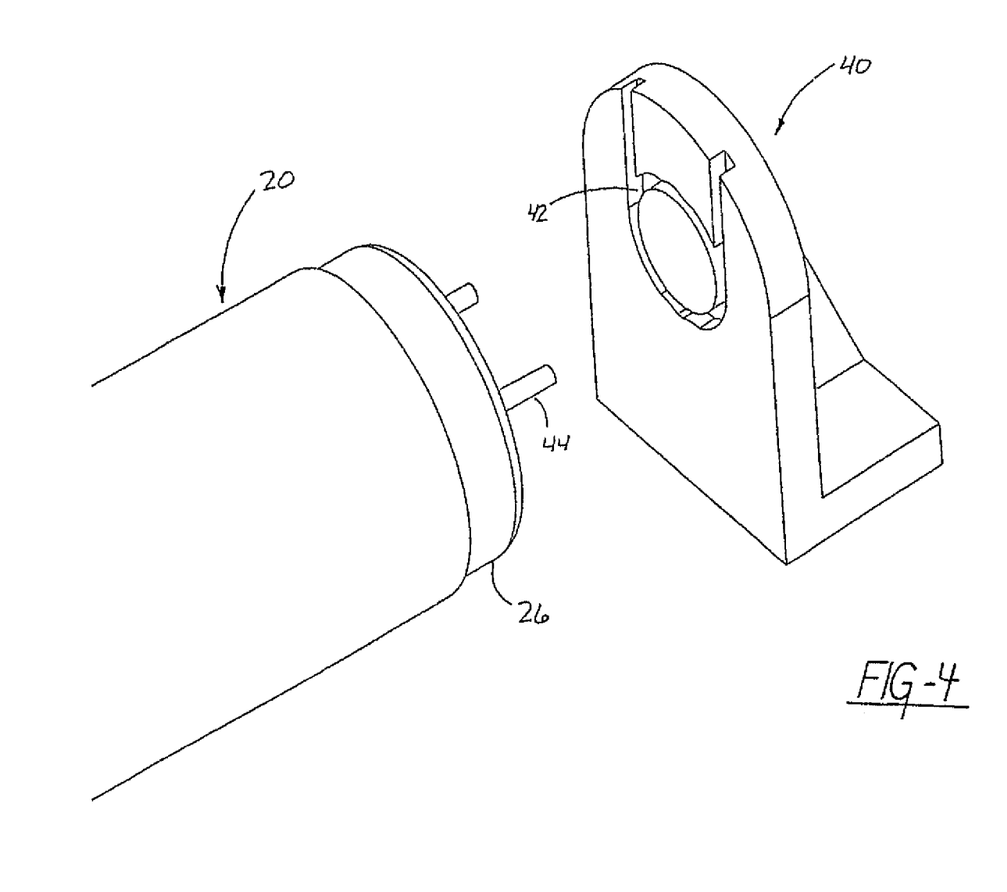
FIG. 4 is a fragmentary, perspective view of one embodiment of the present invention showing one end of the light tube disconnected from one end of a light tube socket.

FIG. 4 is a fragmentary, perspective view of one embodiment of the present invention showing one end of the light tube 20 disconnected from one end of a light tube socket 40. Similar to conventional fluorescent lighting systems and in this embodiment of the present invention, the light tube socket 40 includes a pair of electrical female connectors 42 and the light tube 20 includes a pair of mating electrical male connectors 44.

Within the scope of the present invention, the light tube 20 may be powered by one of four power supply circuits 100, 200, 300, and 400. A first power supply circuit includes a power source and a conventional fluorescent ballast. A second power supply circuit includes a power source and a rectifier/filter circuit. A third power supply circuit includes a DC power source and a PWM (Pulse Width Modulation) circuit. A fourth power supply circuit powers the light tube 20 inductively.

Figure 5:
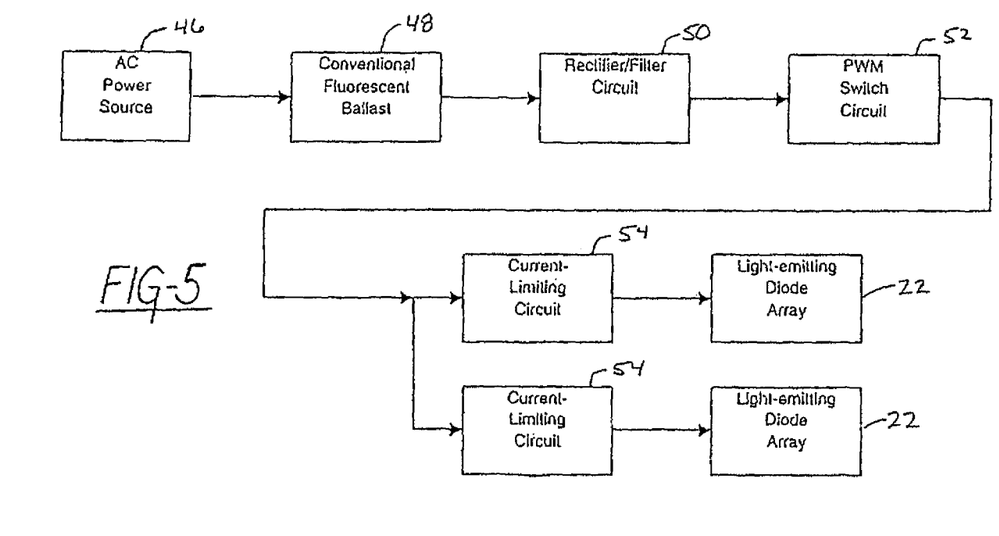
FIG. 5 is an electrical block diagram of a first power supply circuit for supplying power to the light tube.

FIG. 5 is an electrical block diagram of a first power supply circuit 100 for supplying power to the light tube 20. The first power supply circuit 100 is particularly adapted to operate within an existing, conventional fluorescent lighting system. As such, the first power supply circuit 100 includes a conventional fluorescent light tube socket 40 having two electrical female connectors 42 disposed at opposite ends of the socket. Accordingly, a light tube 20 particularly adapted for use with the first power supply circuit 100 includes two end caps 26 and 28, each end cap having the form of an electrical male connector 44 which mates with a corresponding electrical female connector 42 in the socket 40.

The first power supply circuit 100 also includes a power source 46 and a conventional magnetic or electronic fluorescent ballast 48. The power source 46 supplies power to the conventional fluorescent ballast 48.

The first power supply circuit 100 further includes a rectifier/filter circuit 50, a PWM circuit 52, and one or more current-limiting circuits 54. The rectifier/filter circuit 50, the PWM circuit 52, and the one or more current-limiting circuits 54 of the first power supply circuit 100 are packaged inside one of the two end caps 26 or 28 of the light tube 20.

The rectifier/filter circuit 50 receives AC power from the ballast 48 and converts the AC power to DC power. The PWM circuit 52 receives the DC power from the rectifier/filter circuit 50 and pulse-width modulates the DC power to the one or more current-limiting circuits 54. In a preferred embodiment of the present invention, the PWM circuit 52 receives the DC power from the rectifier/filter circuit 50 and cyclically switches the DC power on and off to the one or more current-limiting circuits 54. The DC power is switched on and off by the PWM circuit 52 at a frequency which causes the white light emitted from the LEDs 22 to appear, when viewed with a "naked" human eye, to shine continuously. The PWM duty cycle can be adjusted or varied by control circuitry (not shown) to maintain the power consumption of the LEDs 22 at safe levels.

The DC power is modulated for several reasons. First, the DC power is modulated to adjust the brightness or intensity of the white light emitted from the LEDs 22 and, in turn, adjust the brightness or intensity of the white light emitted from the light tube 20. Optionally, the brightness or intensity of the white light emitted from the light tube 20 may be adjusted by a user. Second, the DC power is modulated to improve the illumination efficiency of the light tube 20 by capitalizing upon a phenomenon in which short pulses of light at high brightness or intensity to appear brighter than a continuous, lower brightness or intensity of light having the same average power. Third, the DC power is modulated to regulate the intensity of light emitted from the light tube 20 to compensate for supply voltage fluctuations, ambient temperature changes, and other such factors that affect the intensity of white light emitted by the LEDs 22. Fourth, the DC power is modulated to raise the variations of the frequency of light above the nominal variation of 120 to 100 Hz thereby reducing illumination artifacts caused by low frequency light variations, including interactions with video screens. Fifth, the DC power may optionally be modulated to provide an alarm function wherein light from the light tube 20 cyclically flashes on and off.

The one or more current-limiting circuits 54 receive the pulse-width modulated or switched DC power from the PWM circuit 52 and transmit a regulated amount of power to one or more arrays of LEDs 22. Each current-limiting circuit 54 powers a bank of one or more white LEDs 22. If a bank of LEDs 22 consists of more than one LED, the LEDs are electrically connected in series in an anode to cathode arrangement. If brightness or intensity variation between the LEDs 22 can be tolerated, the LEDs can be electrically connected in parallel.

The one or more current-limiting circuits 54 may include (1) a resistor, (2) a current-limiting semiconductor circuit, or (3) a switching power supply type current limiter.

Figure 6:
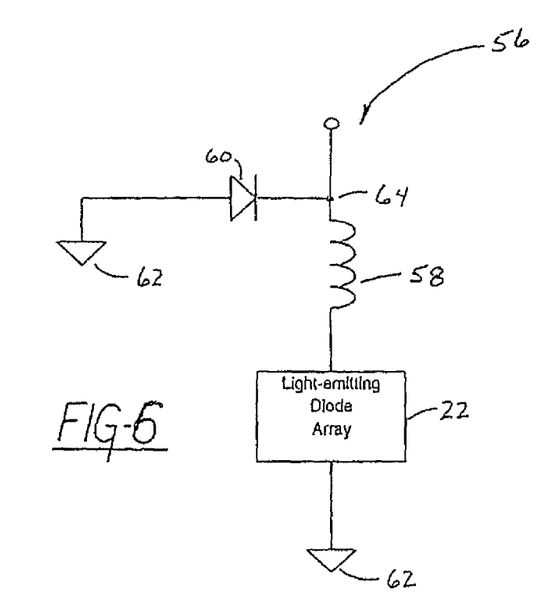
FIG. 6 is an electrical schematic of a switching power supply type current limiter.

FIG. 6 is an electrical schematic of a switching power supply type current limiter 56. The limiter 56 includes an inductor 58, electrically connected in series between the PWM circuit 52 and the array of LEDs 22, and a power diode 60, electrically connected between ground 62 and a PWM circuit/inductor node 64. The diode 60 is designed to begin conduction after the PWM circuit 52 is switched off. In this case, the value of the inductor 58 is adjusted in conjunction with the PWM duty cycle to provide the benefits described above. The switching power supply type current limiter 56 provides higher power efficiency than the other types of current-limiting circuits listed above.

Figure 7:
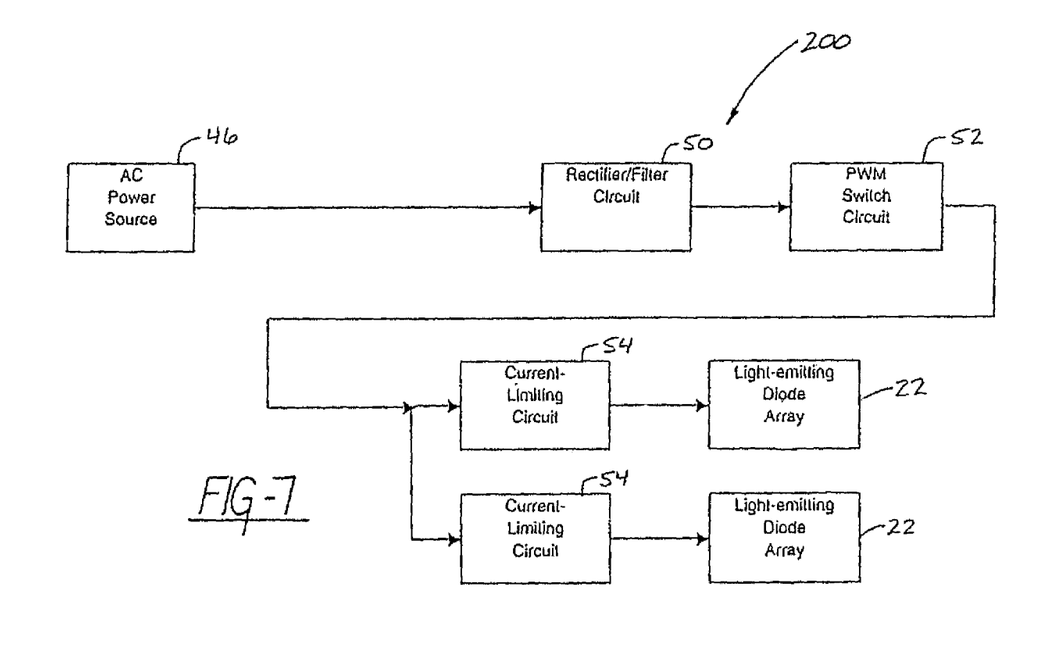
FIG. 7 is an electrical block diagram of a second power supply circuit for supplying power to the light tube.

FIG. 7 is an electrical block diagram of a second power supply circuit 200 for supplying power to the light tube 20. Similar to the first power supply circuit 100, the second power supply circuit 200 includes a conventional fluorescent light tube socket 40 having two electrical female connectors 42 disposed at opposite ends of the socket 40. Accordingly, a light tube 20 particularly adapted for use with the second power supply circuit 200 includes two end caps 26 and 28, each end cap having the form of an electrical male connector 44 which mates with a corresponding electrical female connector 42 in the socket 40.

In the second power supply circuit 200, the power source 46 supplies power directly to the rectifier/filter circuit 50. The rectifier/filter circuit 50, the PWM circuit 52, and the one or more current-limiting circuits 54 operate as described above to power the one or more arrays of LEDs 22. The rectifier/filter circuit 50, the PWM circuit 52, and the one or more current-limiting circuits 54 of the second power supply circuit 200 are preferably packaged inside the end caps 26 and 28 or the bulb portion 24 of the light tube 20 or inside the light tube socket 40.

Figure 8:
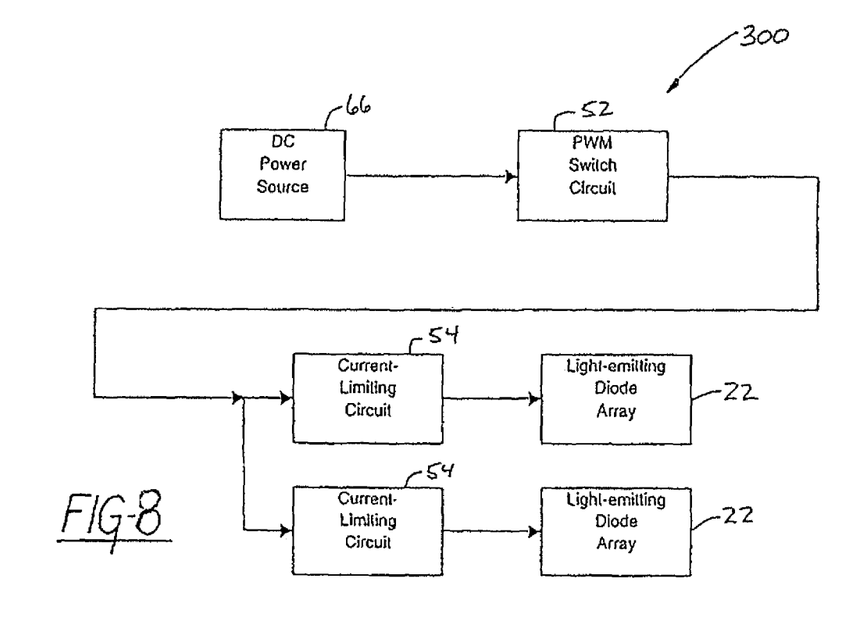
FIG. 8 is an electrical block diagram of a third power supply circuit for supplying power to the light tube.

FIG. 8 is an electrical block diagram of a third power supply circuit 300 for supplying power to the light tube 20. Similar to the first and second power supply circuits 100 and 200, the third power supply circuit 300 includes a conventional fluorescent light tube socket 40 having two electrical female connectors 42 disposed at opposite ends of the socket 40. Accordingly, a light tube 20 particularly adapted for use with the third power supply circuit 300 includes two end caps 26 and 28, each end cap having the form of an electrical male connector 44 which mates with a corresponding electrical female connector 42 in the socket 40.

The third power supply circuit 300 includes a DC power source 66, such as a vehicle battery. In the third power supply circuit 300, the DC power source 66 supplies DC power directly to the PWM circuit 52. The PWM circuit 52 and the one or more current-limiting circuits 54 operate as described above to power the one or more arrays of LEDs 22. In the third power supply circuit 300, the PWM circuit 52 is preferably packaged in physical location typically occupied by the ballast of a conventional fluorescent lighting system while the one or more current-limiting circuits 54 and LEDs 22 are preferably packaged inside the light tube 20, in either one of the two end caps 26 or 28 or the bulb portion 24.

Figure 9:
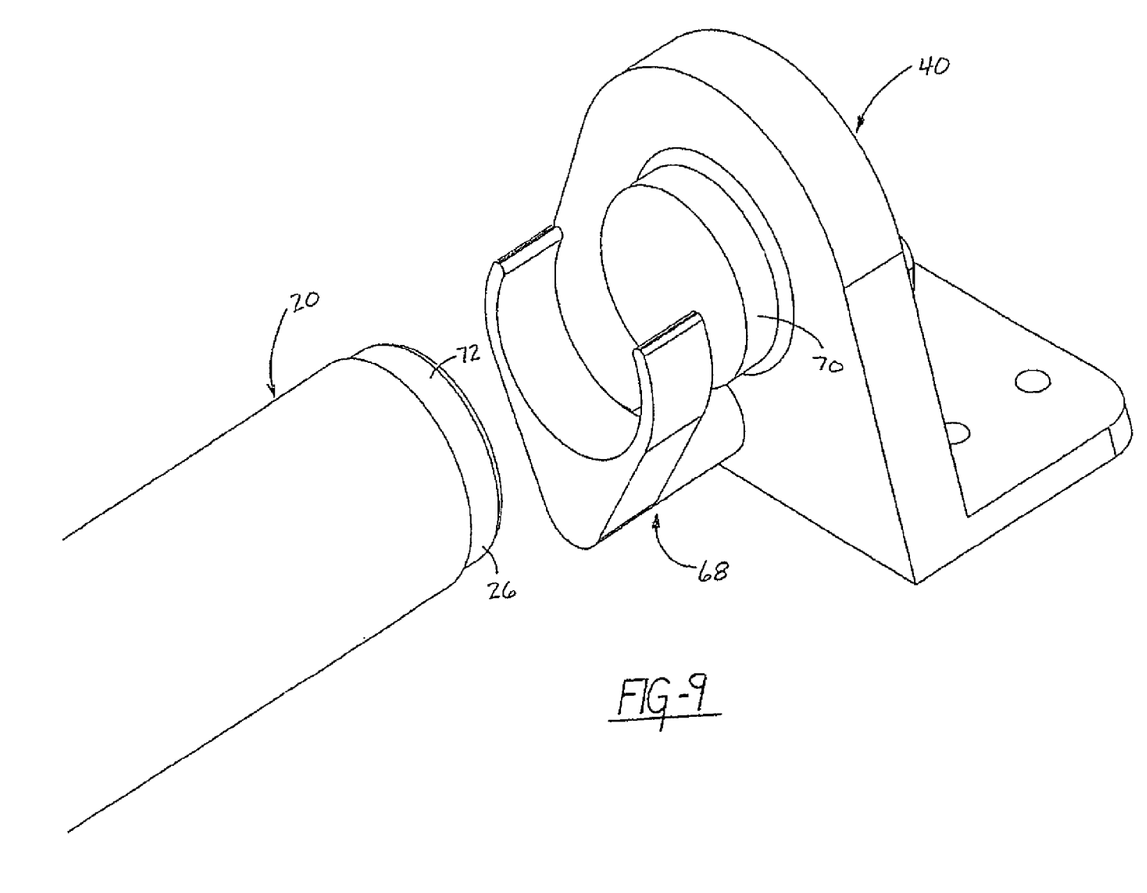
FIG. 9 is a fragmentary, perspective view of another embodiment of the present invention showing one end of the light tube disconnected from one end of the light tube socket.

FIG. 9 is a fragmentary, perspective view of another embodiment of the present invention showing one end of the light tube 20 disconnected from one end of the light tube socket 40. In this embodiment of the present invention, the light tube socket 40 includes a pair of brackets 68 and the light tube 20 includes a pair of end caps 26 and 28 which mate with the brackets 68.

Figure 10:
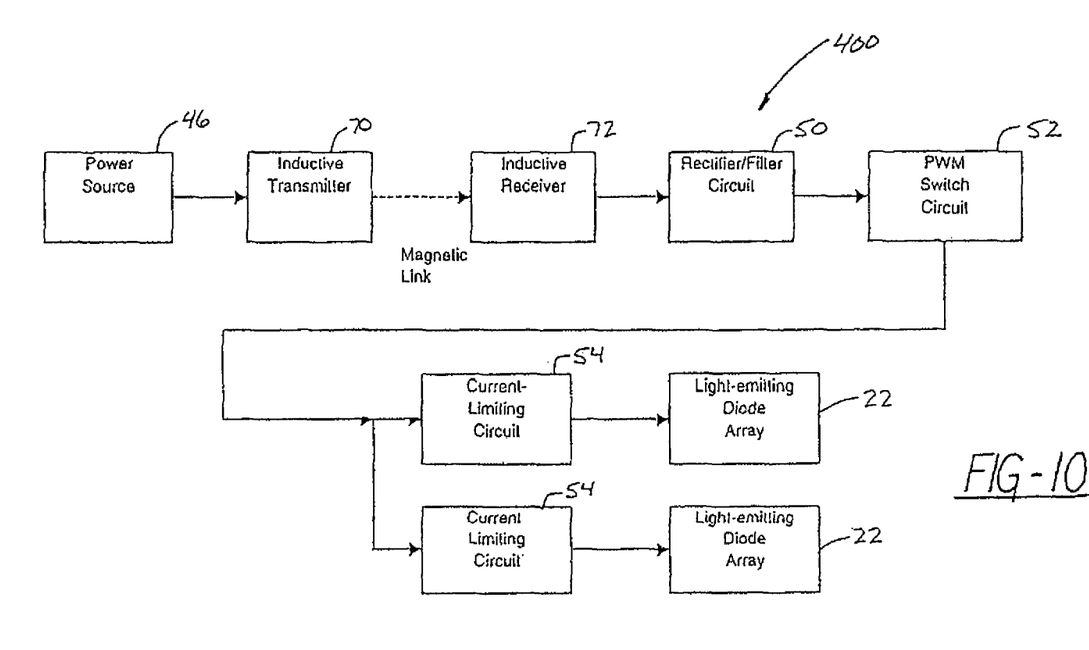
FIG. 10 is an electrical block diagram of a fourth power supply circuit for supplying power to the light tube.

FIG. 10 is an electrical block diagram of a fourth power supply circuit 400 for supplying power to the light tube 20. Unlike the first, second, and third power supply circuits 100, 200, and 300 which are powered through direct electrical male and female connectors 44 and 42, the fourth power supply circuit 400 is powered inductively. As such, the fourth power supply circuit 400 includes a light tube socket 40 having two brackets 68 disposed at opposite ends of the socket 40. At least one bracket 68 includes an inductive transmitter 70. Accordingly, a light tube 20 particularly adapted for use with the fourth power supply circuit 400 has two end caps 26 and 28 with at least one end cap including an inductive receiver or antenna 72. When the light tube 20 is mounted in the light tube socket 40, the at least one inductive receiver 72 in the light tube 20 is disposed adjacent to the at least one inductive transmitter 70 in the light tube socket 40.

The fourth power supply circuit 400 includes the power source 46 which supplies power to the at least one inductive transmitter 70 in the light tube socket 40. The at least one transmitter 70 inductively supplies power to the at least one receiver 72 in one of the end caps 26 and/or 28 of the light tube 20. The at least one inductive receiver 72 supplies power to the rectifier/filter circuit 50. The rectifier/filter circuit 50, PWM circuit 52, and the one or more current-limiting circuits 54 operate as described above to power the one or more arrays of LEDs 22. In this manner, the light tube 20 is powered without direct electrical connection.

What is claimed is:

1. A lighting device connectable to a socket of a light fixture, comprising:
    a housing having a first end and a second end, wherein at least a portion of the housing is transparent or translucent;
    an end cap disposed on one of the first end or the second end of the housing and configured to fit with the socket; and
    a plurality of light emitting diodes disposed inside and extending between the first and second ends of the housing, wherein the plurality of light emitting diodes is arranged to provide light through at least a portion of the transparent or translucent portion of the housing; wherein
    a power source is electrically connected to and configured to provide power to the plurality of light emitting diodes through a pulse width modulation circuit and a current limiting circuit, the current limiting circuit comprising an inductive element coupled between the pulse width modulation circuit and at least some of the plurality of light emitting diodes.

2. The lighting device of claim 1 wherein the end cap is a first end cap disposed on the first end of the housing, the housing comprises an elongate tube and the light fixture is a fluorescent light fixture, the lighting device further comprising:
    a second end cap disposed on the second end of the housing, the second end cap configured to fit with the socket.

3. The lighting device of claim 2 wherein the first end cap and the second end cap comprise a respective pair of electrical bi-pin connectors.

4. The lighting device of claim 1 wherein the current limiting circuit is a switching power supply type current limiter.

5. The lighting device of claim 1 wherein the pulse width modulation circuit and the current limiting circuit are packaged inside the housing.

6. The lighting device of claim 1 wherein the pulse width modulation circuit and the current limiting circuit are packaged inside the socket.

7. The lighting device of claim 1 wherein the power source is an AC power source or a DC power source and a rectifier is electrically connected to the AC power source to receive AC input and electrically connected to the pulse width modulation circuit to provide DC output to the pulse width modulation circuit when the power source is the AC power source.

8. The lighting device of claim 7 wherein the rectifier receives the AC input from a conventional fluorescent ballast electrically connected to the AC power source.

9. The lighting device of claim 7 wherein the power source is a DC power source in the form of a battery, the battery providing the DC output to the pulse width modulation circuit.

10. The lighting device of claim 1 wherein the pulse width modulation circuit is configured to switch DC power to the plurality of light emitting diodes on and off at a frequency that causes the light emitted from the plurality of light emitting diodes to appear, when viewed by a human eye, to shine continuously.

11. The lighting device of claim 1 wherein the pulse width modulation circuit modulates a frequency of light emitted from the plurality of light emitting diodes above a nominal variation of 120 to 100 Hz.

12. The lighting device of claim 1 wherein the pulse width modulation circuit modulates a frequency of light emitted from the plurality of light emitting diodes to provide a visible on and off cycle.

13. The lighting device of claim 1 wherein the end cap is coupled to the power source through a magnetic link.

14. The lighting device of claim 13 wherein the magnetic link comprises an inductive transmitter and an inductive receiver.

15. The lighting device of claim 1, further comprising:
    a circuit board mounted within the housing, and wherein the light emitting diodes are arranged such that the radiation pattern of light emitted therefrom is centered at a 90° angle relative to the circuit board.

16. The lighting device of claim 15 wherein the plurality of light emitting diodes are mounted on only one side of the circuit board.

17. The lighting device of claim 15 wherein the circuit board has an H-shaped cross-section when viewed from the first end of the housing.

18. A lighting device connectable to a socket of a light fixture, comprising:

a housing having a first end and a second end, wherein at least a portion of the housing is light-transmissive;

an end cap disposed on one of the first end or the second end of the housing and configured to fit with the socket; and a plurality of light emitting diodes disposed inside and extending between the first and second ends of the housing, wherein the plurality of light emitting diodes is arranged to provide light through at least a portion of the light-transmissive portion of the housing;

a pulse width modulation circuit configured to receive power from a power source; and a current limiting circuit comprising an inductive element coupled between the pulse width modulation circuit and at least some of the plurality of light emitting diodes.

19. The lighting device of claim 18 wherein the end cap is a first end cap disposed on the first end of the housing, the housing comprises an elongate tube and the light fixture is a fluorescent light fixture, the lighting device further comprising:

a second end cap disposed on the second end of the housing, the second end cap configured to fit with the socket, wherein the first end cap and the second end cap comprise a respective pair of electrical bi-pin connectors.

20. The lighting device of claim 18 wherein the pulse width modulation circuit and the current limiting circuit are packaged inside the housing.

* * * * *